(12) United States Patent
Nam et al.

(10) Patent No.: US 8,692,702 B2
(45) Date of Patent: Apr. 8, 2014

(54) ANALOG-DIGITAL CONVERTER AND POWER SAVING METHOD THEREOF

(75) Inventors: Jaewon Nam, Daejeon (KR); Young Kyun Cho, Daejeon (KR); Yil Suk Yamg, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 14 days.

(21) Appl. No.: 13/615,052

(22) Filed: Sep. 13, 2012

(65) Prior Publication Data
US 2013/0076552 A1 Mar. 28, 2013

(30) Foreign Application Priority Data

Sep. 22, 2011 (KR) .......................... 10-2011-0095886

(51) Int. Cl.
*H03M 1/34* (2006.01)
(52) U.S. Cl.
USPC ........... 341/165; 455/126; 455/272; 455/522; 455/293; 455/446; 332/144; 375/296; 375/297; 341/155; 341/160; 341/166; 370/338; 360/17; 360/64
(58) Field of Classification Search
USPC .......... 341/140–165; 455/126, 272, 522, 293, 455/446; 332/144; 375/296, 297; 370/338; 360/99.17, 64
See application file for complete search history.

(56) References Cited

U.S. PATENT DOCUMENTS

| | | | | |
|---|---|---|---|---|
| 5,121,265 A | * | 6/1992 | Hirose et al. | 360/64 |
| 5,545,999 A | * | 8/1996 | Mueller et al. | 324/322 |
| 5,546,069 A | * | 8/1996 | Holden et al. | 340/407.1 |
| 5,752,170 A | * | 5/1998 | Clifford | 455/126 |
| 5,930,072 A | * | 7/1999 | Shrinkle | 360/99.17 |
| 6,055,422 A | * | 4/2000 | Saitoh | 455/277.1 |
| 6,360,089 B1 | * | 3/2002 | Saitoh | 340/7.1 |
| 6,744,395 B1 | | 6/2004 | Perelman et al. | |
| 7,456,693 B2 | * | 11/2008 | Zannoth et al. | 330/296 |
| 7,830,220 B2 | * | 11/2010 | Ceylan et al. | 332/145 |
| 7,834,793 B2 | | 11/2010 | Carreau et al. | |
| 7,907,920 B2 | * | 3/2011 | Chan et al. | 455/126 |
| 8,160,517 B2 | * | 4/2012 | Chan et al. | 455/126 |
| 8,248,732 B2 | * | 8/2012 | Nishiyama et al. | 360/245.9 |
| 8,295,792 B2 | * | 10/2012 | Chan et al. | 455/126 |
| 2010/0156685 A1 | | 6/2010 | Westwick et al. | |
| 2011/0057823 A1 | | 3/2011 | Harpe | |

* cited by examiner

*Primary Examiner* — Lam T Mai

(57) ABSTRACT

Disclosed is an analog-digital converter which includes a pre-amplifier configured to output a comparison result between a sampled analog input signal and a reference signal and to control a power supply operation in response to a power control signal; a digital signal processor configured to generate a digital signal based on the comparison result; a power controller configured to generate an amplifier operation clock signal for controlling the pre-amplifier; and a counter configured to count the number of falling edges of the amplifier operation clock signal and to detect a power interruption point of time of the pre-amplifier according to the counted falling edge number. The power controller generates the power control signal for interrupting a power to be supplied to the pre-amplifier when the power interruption point of time of the pre-amplifier is detected.

15 Claims, 6 Drawing Sheets

ANALOG-DIGITAL CONVERTER AND POWER SAVING METHOD THEREOF

CROSS-REFERENCE TO RELATED APPLICATIONS

A claim for priority under 35 U.S.C. §119 is made to Korean Patent Application No. 10-2011-0095886 filed Sep. 22, 2011, in the Korean Intellectual Property Office, the entire contents of which are hereby incorporated by reference.

BACKGROUND

The inventive concepts described herein relate to an analog-digital converter, and more particularly, relate to an analog-digital converter capable of reducing a power and a power saving method thereof.

An analog-digital converter may be a device for converting an analog signal into a digital signal. For example, analog-digital converters may include a successive approximation register analog-digital converter (hereinafter, referred to as SAR-ADC) that operates in an asynchronous manner. The SAR-ADC may perform a conversion operation (N being an integer) N times within a predetermined period of time. That is, the SAR-ADC may perform an operation for converting an analog signal into a digital signal N times.

However, N conversion operations may not be performed constantly due to a level of an input signal. Thus, the N conversion operations may be ended within a time shorter than a predetermined time of the SAR-ADC.

The SAR-ADC may conduct a normal operation in which a power is consumed constantly during a predetermined period of time. However, an asynchronous analog-digital converter such as the SAR-ADC may still consume a power at a period in which analog-to-digital conversion is not performed.

SUMMARY

Example embodiments of the inventive concept provide an analog-digital converter comprising a pre-amplifier configured to output a comparison result between a sampled analog input signal and a reference signal and to control a power supply operation in response to a power control signal; a digital signal processor configured to generate a digital signal based on the comparison result; a power controller configured to generate an amplifier operation clock signal for controlling the pre-amplifier; and a counter configured to count the number of falling edges of the amplifier operation clock signal and to detect a power interruption point of time of the pre-amplifier according to the counted falling edge number. The power controller generates the power control signal for interrupting a power to be supplied to the pre-amplifier when the power interruption point of time of the pre-amplifier is detected.

In example embodiments, the power controller generates the amplifier operation clock signal such that high-level periods have the same period of time.

In example embodiments, the counter detects the power interruption point of time of the pre-amplifier when the number of falling edges reaches a predetermined number.

In example embodiments, the digital signal processor comprises an asynchronous latch unit configured to latch the comparison result to generate a digital signal; and an asynchronous clock generating unit configured to generate a latch operation clock signal for controlling the asynchronous latch unit.

In example embodiments, when one digital data included in the digital signal is generated, the asynchronous latch unit generates a latch operation end signal for setting the latch operation clock signal to a low state.

In example embodiments, the power controller sets the amplifier operation clock signal to a logical high state in response to the latch operation end signal.

In example embodiments, the analog-digital converter further comprises a system clock generating unit configured to generate a system clock signal in response to an external clock signal.

In example embodiments, the system clock generating unit comprises a first system clock generating unit configured to generate a first system clock signal in response to the external clock signal; and a second system clock generating unit configured to generate a second system clock signal by delaying the first system clock signal.

In example embodiments, the second system clock signal is used to operate the analog-digital converter and the first system clock signal is used to generate the power control signal.

In example embodiments, the analog-digital converter further comprises an input signal sampler configured to sample an analog input signal to generated a sampled analog signal; and a reference signal generator configured to a reference signal for generation of a digital signal from the sampled analog signal.

In example embodiments, the analog-digital converter further comprises a power supplier configured to power the pre-amplifier.

In example embodiments, the pre-amplifier comprises a switch connected to the power supplier and configured to selectively supply a power for the pre-amplifier in response to the power control signal.

Example embodiments of the inventive concept also provide a power saving method of an analog-digital converter comprising supplying a power to a pre-amplifier for outputting a comparison result between an input analog signal and a reference signal; judging whether the number of data included in a digital signal exceeds a predetermined number, when the digital signal is generated from the analog signal according to the comparison result; and interrupting the power supplied to the pre-amplifier when the number of data included in the digital signal exceeds the predetermined number.

In example embodiments, the supplying a power to a pre-amplifier comprises receiving a clock signal for activating the pre-amplifier after the power is supplied.

In example embodiments, the interrupting the power supplied to the pre-amplifier comprises counting the number of falling edges of the amplifier clock signal; and interrupting the power supplied to the pre-amplifier when the counted value reaches a predetermined number.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
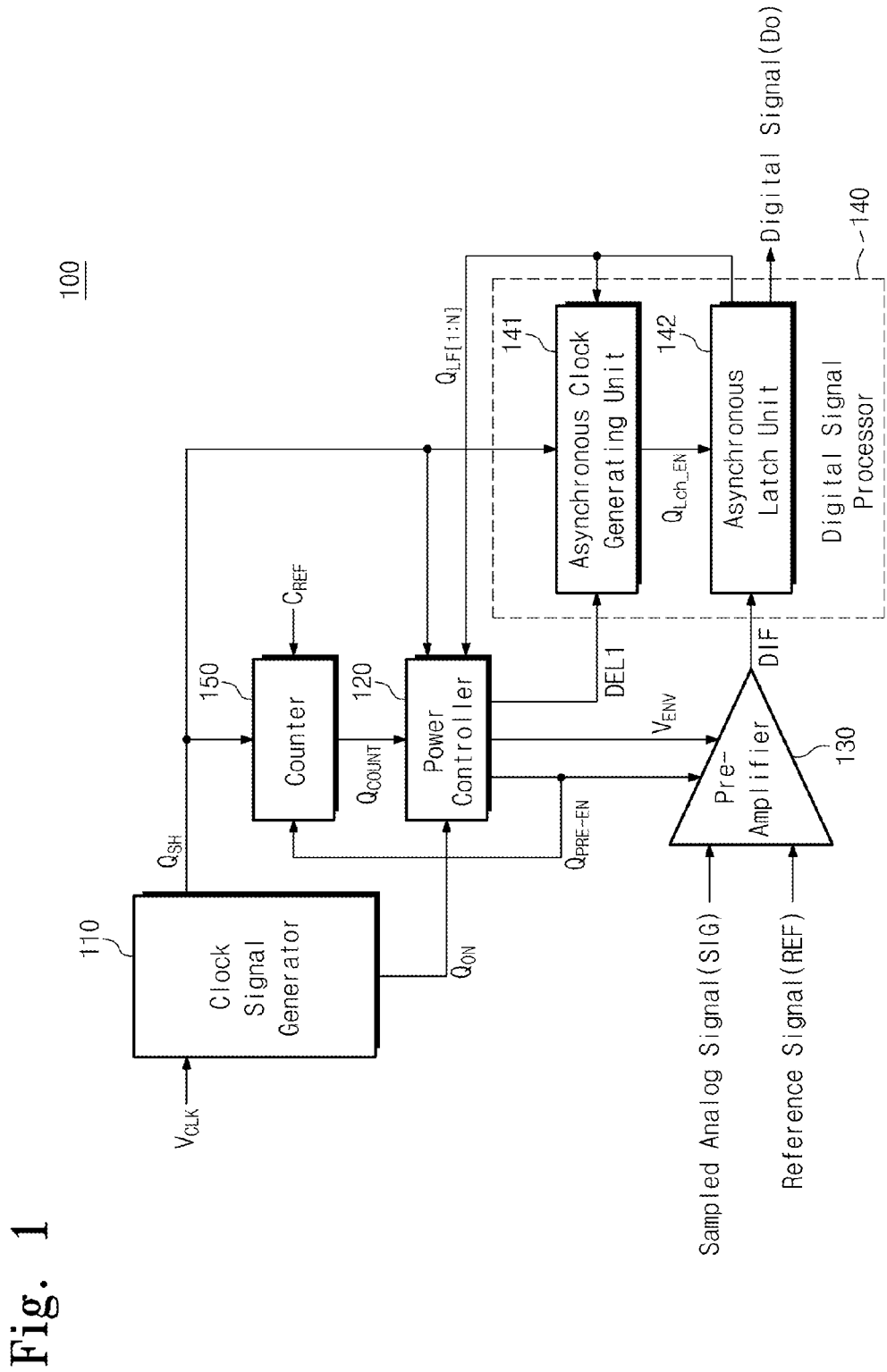
FIG. 1 is a block diagram schematically illustrating an analog-digital converter according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating an analog-digital converter according to an embodiment of the inventive concept.

Referring to FIG. 1, an analog-digital converter 100 may include a clock signal generator 110, a power controller 120, a pre-amplifier 130, a digital signal processor 140, and a counter 150.

The clock signal generator 110 may generate a first system clock signal $Q_{ON}$ and a second system clock signal $Q_{SH}$ in response to a clock signal for system conversion. Herein, the second system clock signal $Q_{SH}$ may be a signal obtained by delaying the first system clock signal $Q_{ON}$ by a predetermined time.

The first system clock signal $Q_{ON}$ may be a signal for supplying a power to the pre-amplifier 130 in advance to convert an analog signal into a digital signal. The second system clock signal $Q_{SH}$ may be a signal for generating a signal which is used to activate the pre-amplifier 130 and the digital signal processor 140.

The clock signal generator 110 may output the first system clock signal $Q_{ON}$ to the power controller 120 and the second system clock signal $Q_{SH}$ to the power controller 120, the digital signal processor 140, and the counter 150.

The power controller 120 may receive the first system clock signal $Q_{ON}$ and the second system clock signal $Q_{SH}$. The power controller 120 may receive latch operation end signals $Q_{LF1}$ to $Q_{LFN}$ and a count signal $Q_{COUNT}$ for interrupting a power.

The power controller 120 may generate an amplifier operation clock signal $Q_{PRE-EN}$ for controlling an operation of the pre-amplifier 130. The amplifier operation clock signal $Q_{PRE-EN}$ may transition to a high state in response to the second system clock signal $Q_{SH}$ and the latch operation end signals $Q_{LF1}$ to $Q_{LFN}$ (or, a rising edge may be generated). High periods of an operation clock signal may have the same period of time $T_P$. Thus, the power controller 120 may set the amplifier operation clock signal $Q_{PRE-EN}$ to a low state when the time $T_P$ elapses from transition to a high state (or, a falling edge may be generated). The amplifier operation clock signal $Q_{PRE-EN}$ may be a signal for controlling an operation of the pre-amplifier 130. Therefore, the pre-amplifier 130 may operate during a high-level period being an active period of the amplifier operation clock signal $Q_{PRE-EN}$. The power controller 120 may output the amplifier operation clock signal $Q_{PRE-EN}$ to the pre-amplifier 130.

The power controller 120 may generate a power control signal $V_{EVN}$ using the first system clock signal $Q_{ON}$ and the count signal $Q_{COUNT}$. The power control signal $V_{EVN}$ may be a signal for controlling a power to be supplied to the pre-amplifier 130.

The power controller 120 may control the pre-amplifier 130, and may control a power so as to be selectively supplied to the pre-amplifier 130.

The pre-amplifier 130 may receive a sampled analog signal SIG, a reference signal REF, and the operation clock signal $Q_{PRE-EN}$. The pre-amplifier 130 may output a difference DIF (i.e., an amplifier output signal) between the sampled analog signal SIG and the reference signal REF to the digital signal processor 140 at a high period of the operation clock signal $Q_{PRE-EN}$.

The pre-amplifier 130 may activate or inactivate the pre-amplifier 130 in response to the power control signal $V_{ENV}$. When the power control signal $V_{ENV}$ is at a low state, there may be blocked a power to be supplied to the pre-amplifier 130.

The digital signal processor 140 may generate a digital signal $D_O$ using an amplifier output signal from the pre-amplifier 130. The digital signal processor 140 may output the generated digital signal $D_O$.

The digital signal processor 140 may include an asynchronous clock generating unit 141 and an asynchronous latch unit 142.

The asynchronous clock generating unit 141 may generate a latch operation clock signal $Q_{LCH-EN}$ that is a clock signal for controlling an operation of the asynchronous latch unit 142. The latch operation clock signal $Q_{LCH-EN}$ may transition to a high state in response to a delay signal DEL1 from the pre-amplifier 130 (a rising edge being generated). Herein, the latch operation clock signal $Q_{LCH-EN}$ may transition to a low state in response to the latch operation end signals $Q_{LF1}$ to $Q_{LFN}$ from the asynchronous latch unit 142 (a falling edge being generated). The latch operation clock signal $Q_{LCH-EN}$ may be a signal for controlling an operation of the asynchronous latch unit 142. Therefore, the asynchronous latch unit 142 may operate at a high-level period being an active period of the latch operation clock signal $Q_{LCH-EN}$. The asynchronous clock generating unit 141 may output the latch operation clock signal $Q_{LCH-EN}$ to the asynchronous latch unit 142.

The asynchronous latch unit 142 may receive an amplifier output signal of the pre-amplifier 130 and the latch operation clock signal $Q_{LCH-EN}$. During a high period of the latch operation clock signal $Q_{LCH-EN}$, the asynchronous latch unit 142 may latch the amplifier output signal to output it as the digital signal $D_O$. At this time, the asynchronous latch unit 142 may output a high state of the digital signal $D_O$ when a sign of the amplifier output signal is positive and a low state of the digital signal $D_O$ when a sign of the amplifier output signal is negative.

The asynchronous latch unit 142 may set the latch operation end signals $Q_{LF1}$ to $Q_{LFN}$ having a low state to a high state whenever an operation for generating a digital signal $D_O$ is ended. The asynchronous latch unit 142 may output the latch operation end signals $Q_{LF1}$ to $Q_{LFN}$ to the asynchronous clock generating unit 141 and the power controller 120.

The counter 150 may receive the amplifier operation clock signal $Q_{PRE-EN}$ and a count reference signal $C_{REF}$. The count reference signal $C_{REF}$ may be a reference signal used to count the number of falling edges of the amplifier operation clock signal $Q_{PRE-EN}$. Thus, the count reference signal $C_{REF}$ may correspond to the number of falling edges of the amplifier operation clock signal $Q_{PRE-EN}$.

The counter 150 may count the number of falling edges of the amplifier operation clock signal $Q_{PRE-EN}$ (e.g., increasing a count step voltage $Q_{PEN}$ in response to a falling edge). At this time, the counter 150 may count using the count step voltage $Q_{PEN}$ until it reaches the count reference signal $C_{REF}$. If the count step voltage $Q_{PEN}$ reaches the count reference signal $C_{REF}$, the counter 150 may generate the count signal $Q_{COUNT}$ for blocking a power supplied to a power amplifier. The counter 150 may output the count signal $Q_{COUNT}$ to the power controller 120.

There is described an example that the counter 150 counts using the count step voltage $Q_{PEN}$. However, the inventive concept is not limited thereto. For example, it is possible to count the number of falling edges of the amplifier operation clock signal $Q_{PRE-EN}$ using various methods.

The counter 150 may count the number of falling edges of the amplifier operation clock signal $Q_{PRE-EN}$ indicating a point of time when N signal conversion operations are completed. Thus, the counter 150 may detect an end point of an operation of the pre-amplifier 130 at a point of time when it corresponds to a conversion number (e.g., N times) ($C_{REF}$).

The power controller 120 may control the pre-amplifier 130 so as to operate only at an actual operating period by inactivating the pre-amplifier 130. Thus, power consumption may be reduced by operating the pre-amplifier 130, which takes the greater portion of power consumption of the analog-digital converter 100, only at a predetermined conversion time.

Figure 2:
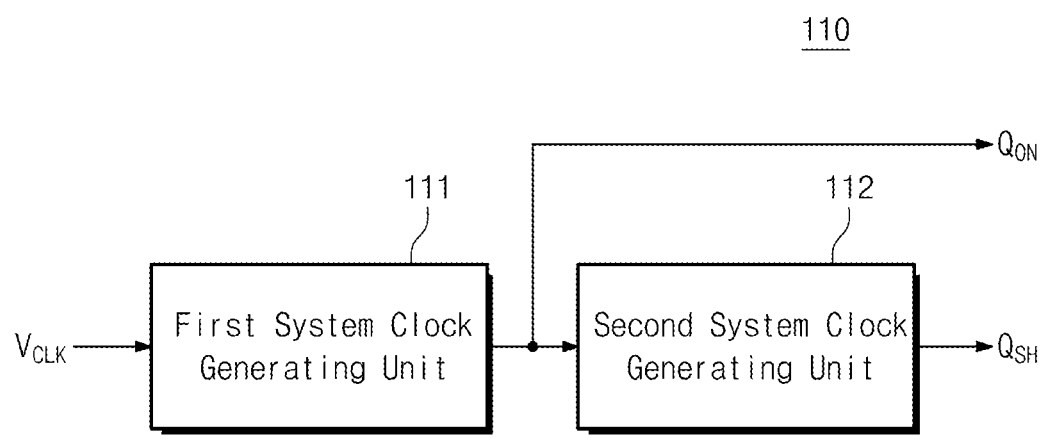
FIG. 2 is a block diagram schematically illustrating a clock signal generator in FIG. 1.

FIG. 2 is a block diagram schematically illustrating a clock signal generator in FIG. 1.

Referring to FIG. 2, a clock signal generator 110 may include a first system clock generating unit 111 and a second system clock generating unit 112.

The first system clock generating unit 111 may generate a first system clock signal $Q_{ON}$ in response to an external clock signal $V_{CLK}$. The first system clock signal $Q_{ON}$ may be a signal for activating a pre-amplifier 130 in advance. Thus, the first system clock signal $Q_{ON}$ may activate a power control signal $V_{ENV}$ from a low state to a high state. The first system clock generating unit 111 may output the first system clock signal $Q_{ON}$ to the second system clock generating unit 112 and a power controller 120.

The second system clock generating unit 112 may generate a second system clock signal $Q_{SH}$ by delaying the first system clock signal $Q_{ON}$ by a predetermined time. A polarity of the second system clock signal $Q_{SH}$ may be opposite to that of the first system clock signal $Q_{ON}$. The second system clock signal $Q_{SH}$ may be a clock signal directing input sampling. The second system clock generating unit 112 may output the second system clock signal $Q_{SH}$ to the power controller 120, a digital signal processor 140, and a counter 150.

Figure 3:
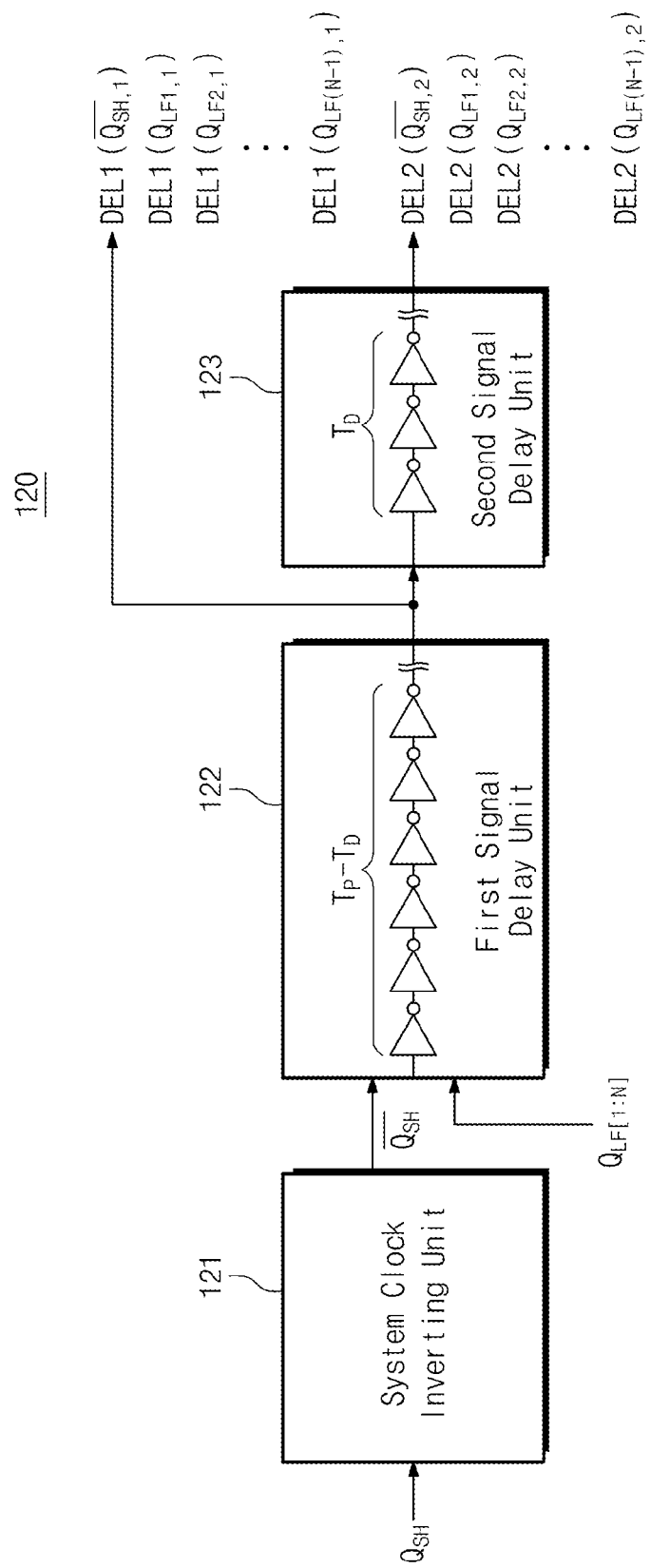
FIG. 3 is a block diagram schematically illustrating a power controller in FIG. 1.

FIG. 3 is a block diagram schematically illustrating a power controller in FIG. 1.

Referring to FIG. 3, a power controller 120 may generate a first delay signal DEL1 and a second delay signal DEL2 for power control.

The power controller 120 may include a system clock inverting unit 121, a first signal delay unit 122, and a second signal delay unit 123.

The system clock inverting unit 121 may receive a second system clock signal $Q_{SH}$. The system clock inverting unit 121 may invert the second system clock signal $Q_{SH}$. The system clock inverting unit 121 may output an inverted version of the second system clock signal $/Q_{SH}$ to the first signal delay unit 122.

The first signal delay unit 122 may receive the inverted version of the second system clock signal $/Q_{SH}$ and latch operation end signals $Q_{LF1}$ to $Q_{LFN}$. The first signal delay unit 122 may delay the inverted version of the second system clock signal $/Q_{SH}$ by a constant time of $(T_P-T_D)$ to output a first delay signal DEL1$\{/Q_{SH},1\}$. The first delay signal DEL1 may be delayed by a first time of $(T_P-T_D)$. Herein, $T_P$ may indicate a time corresponding to a logical high period of one clock of an amplifier operation clock signal $Q_{PRE-EN}$, and $T_N$ may indicate a time for activating an asynchronous latch unit 142 in advance for activation of the asynchronous latch unit 142 before an operation of a pre-amplifier 130.

The first signal delay unit 122 may generate first delay signals DEL1$\{/Q_{SH,1}\}$, DEL1$\{Q_{LF1,1}\}$, DEL1$\{Q_{LF2,1}\}$ . . . , DEL1$\{Q_{LF(N-1),1}\}$ for generating different clocks within the amplifier operation clock signal $Q_{PRE-EN}$ using the latch operation end signals $Q_{LF1}$ to $Q_{LFN}$.

The first signal delay unit 122 may output the first delay signals DEL1$\{/Q_{SH,1}\}$, DEL1$\{Q_{LF1,1}\}$, DEL1$\{Q_{LF2,1}\}$, . . . , DEL1$\{Q_{LF(N-1),1}\}$ to the second signal delay unit 123.

The second signal delay unit 123 may delay the first delay signal DEL1 by a constant time $T_D$ to generate a second delay signal DEL2$\{/Q_{SH,2}\}$. The second delay signal DEL2 may be delayed by a constant time $T_D$ compared with a signal $Q_{SH}$ input to the first signal delay unit 122.

The second signal delay unit 123 may delay the first delay signals DEL1$\{/Q_{SH,1}\}$, DEL1$\{Q_{LF1,1}\}$, DEL1$\{Q_{LF2,1}\}$, . . . , DEL1$\{Q_{LF(N-1),1}\}$ by a constant time $T_D$ to generate second delay signals DEL2$\{/Q_{SH},2\}$ DEL2$\{Q_{LF1,2}\}$, DEL2$\{Q_{LF2},2\}$, . . . , DEL2$\{Q_{LF(N-1)},2\}$.

Afterwards, the first signal delay unit 122 and the second signal delay unit 123 may continue to generate the first delay signals DEL1 delayed by $(T_P-T_D)$ and the second delay signals DEL2 delayed by $T_P$ on the basis of the inverted version of the second system clock signal $/Q_{SH}$ and the latch signal end signals $Q_{LF1}$ to $Q_{LFN}$.

Each of the first signal delay unit 122 and the second signal delay unit 123 may include at least one inverter (or, buffer) for delay.

Figure 4:
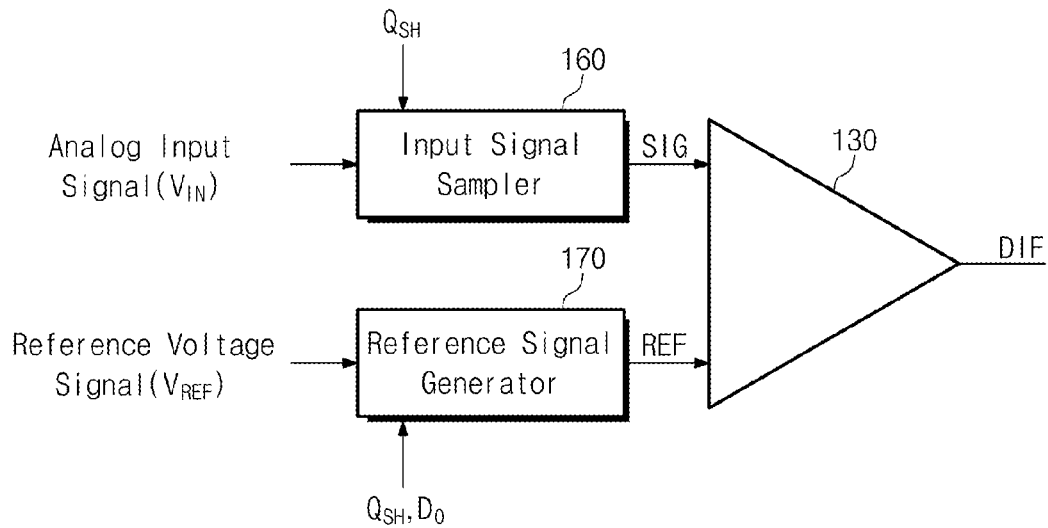
FIG. 4 is a block diagram illustrating an input signal sampler and a reference signal generator for generating signals input to a pre-amplifier of an analog-digital converter according to an embodiment of the inventive concept.

FIG. 4 is a block diagram illustrating an input signal sampler and a reference signal generator for generating signals input to a pre-amplifier of an analog-digital converter according to an embodiment of the inventive concept.

Referring to FIG. 4, an analog-digital converter 100 may further include an input signal sampler 160 and a reference signal generator 170 that are connected to a pre-amplifier 130.

The input signal sampler 160 may sample an analog input signal $V_{IN}$ at a falling edge of a second system clock signal $Q_{SH}$ according to a system conversion speed to output the sampled analog signal SIG to the pre-amplifier 130.

The reference signal generator 170 may receive a reference voltage signal $V_{REF}$ and a digital signal $D_O$. The reference signal generator 170 may generate a reference signal REF based on the reference voltage signal $V_{REF}$ and the digital signal $D_O$. The reference signal REF may be a signal for generating a digital signal according to comparison with the sampled analog signal SIG. The reference signal generator 170 may provide the reference signal REF to the pre-amplifier 130.

Figure 5:
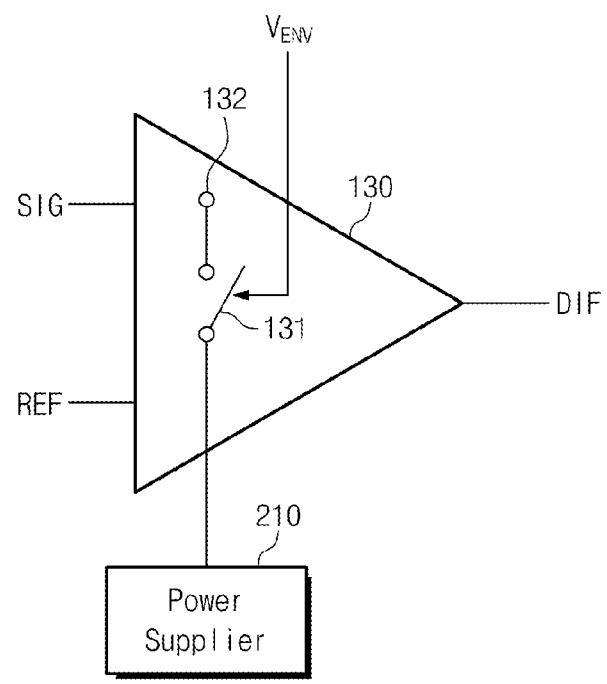
FIG. 5 is a block diagram schematically illustrating a pre-amplifier according to an embodiment of the inventive concept.

FIG. 5 is a block diagram schematically illustrating a pre-amplifier according to an embodiment of the inventive concept.

Referring to FIG. 5, an analog-digital converter 100 may further include a power supplier 210 powering a pre-amplifier 130. The power supplier 210 may be installed inside or outside the analog-digital converter 100.

The pre-amplifier 130 may include a switch 131. The switch 131 may be configured to selectively supply a power to the inside of the pre-amplifier 130.

The switch 131 may be connected to a terminal 132 for supplying a power to the inside of the pre-amplifier 130 and the power supplier 210.

A power may be selectively supplied to the pre-amplifier 130 by turning on or off the switch 131 according to a power control signal $V_{ENV}$ provided from a power controller 120. When the power control signal $V_{ENV}$ for power supply is input (e.g., the power control signal $V_{ENV}$ is at a logical high state), the switch 131 may be turned on to power the pre-amplifier 130.

When the power control signal $V_{ENV}$ for power interruption is input (e.g., the power control signal $V_{ENV}$ is at a logical low state), the switch 131 may be turned off to block a power supplied to the pre-amplifier 130.

Figure 6:
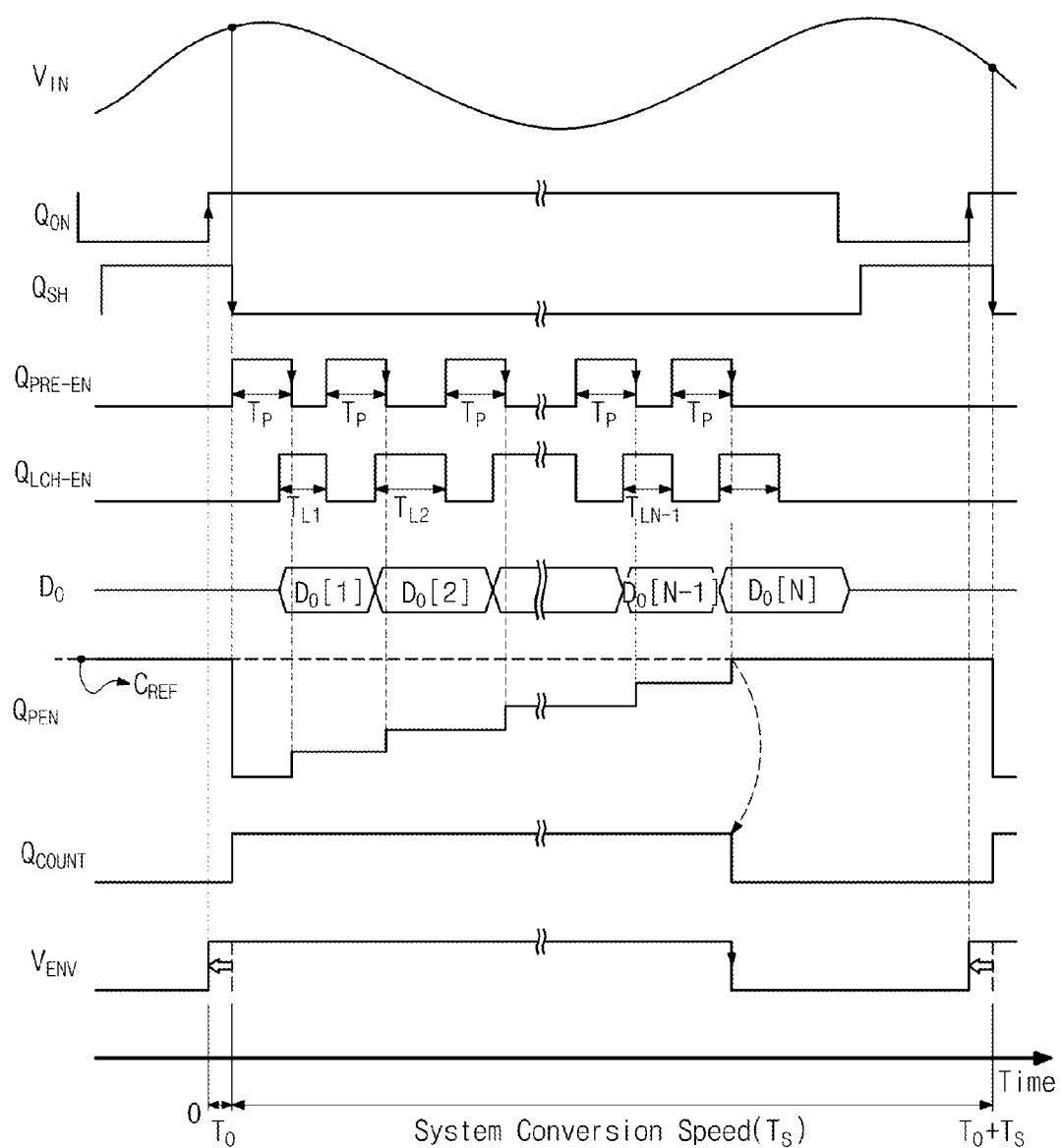
FIG. 6 is a timing diagram illustrating clock signals of an analog-digital converter according to an embodiment of the inventive concept.

FIG. 6 is a timing diagram illustrating clock signals of an analog-digital converter according to an embodiment of the inventive concept.

Referring to FIG. 6, an analog signal $T_P$ may be an input signal to be converted into a digital signal $D_O$.

A first system clock signal $Q_{ON}$ may be a signal generated from an external clock signal $V_{CLK}$. A second system clock signal $Q_{SH}$ may be a signal by inverting and delaying the first system clock signal $Q_{ON}$. Herein, the first system clock signal $Q_{ON}$ may be used as a system clock signal for operation of an analog-digital converter.

A power control signal $V_{ENV}$ may transition to a high state at a rising edge of the first system clock signal $Q_{ON}$. This means that a power is supplied to a pre-amplifier 130. Thus, the pre-amplifier 130 may be activated before a time $T_0$ such that analog-digital conversion is stably performed.

An amplifier operation clock signal $Q_{PRE-EN}$ may be activated (or, transition to a high state) in synchronization with a falling edge of the second system clock signal $Q_{SH}$. A count step signal $Q_{PEN}$ may be generated in synchronization with a falling edge of the second system clock signal $Q_{SH}$. A count signal $Q_{COUNT}$ may be activated to transition to a high state.

High-level periods of an amplifier operation clock signal $Q_{PRE-EN}$ may have the same time $T_P$. The amplifier operation clock signal $Q_{PRE-EN}$ may be used to activate an analog-digital conversion operation at a pre-amplifier 130. That is, the pre-amplifier 130 may output a difference value DIF between a sampled analog signal SIG and a reference signal REF at a high-level period of the amplifier operation clock signal $Q_{PRE-EN}$.

A latch operation clock signal $Q_{LCH-EN}$ may be activated before the amplifier operation clock signal $Q_{PRE-EN}$ transitions from a high level to a low level. The latch operation clock signal $Q_{LCH-EN}$ may be a signal for generating a digital signal $D_O$ at an asynchronous latch unit 142. The asynchronous latch unit 142 may output the digital signal $D_O$ during a clock period of the latch operation clock signal $Q_{LCH-EN}$.

The inactivated amplifier operation clock signal $Q_{PRE-EN}$ may transition to a high signal at a falling edge of the latch operation clock signal $Q_{LCH-EN}$.

With the above description, a digital signal $D_O$ including N digital data $D_O[1]$ to $D_O[N]$ may be generated according to the amplifier operation clock signal $Q_{PRE-EN}$ and the latch operation clock signal $Q_{LCH-EN}$.

A count step signal $Q_{PEN}$ may be sequentially increased every falling edge of the amplifier operation clock signal $Q_{PRE-EN}$. When the number of falling edges of the amplifier operation clock signal $Q_{PRE-EN}$ is N, the count step signal $Q_{PEN}$ may reach a count reference signal $C_{REF}$.

At this time, if N falling edges of the amplifier operation clock signal $Q_{PRE-EN}$ are detected according to the count step signal $Q_{PEN}$, the count signal $Q_{COUNT}$ may be inactivated to transition to a low state.

The power control signal $V_{ENV}$ may transition to a low state according to the count signal $Q_{COUNT}$ transitioning to a low state (at a falling edge). That is, a power supplied to a pre-amplifier 130 may be interrupted. In other words, the pre-amplifier 130 may be inactivated by the power control signal $V_{ENV}$ going to a low state.

An analog-digital converter 100 of the inventive concept may inactivate a pre-amplifier 130 at a point of time when a digital signal including N digital data is generated within a time $T_s$ of a system conversion speed. Thus, the analog-digital converter 100 of the inventive concept may save a power consumed by the pre-amplifier 130.

Figure 7:
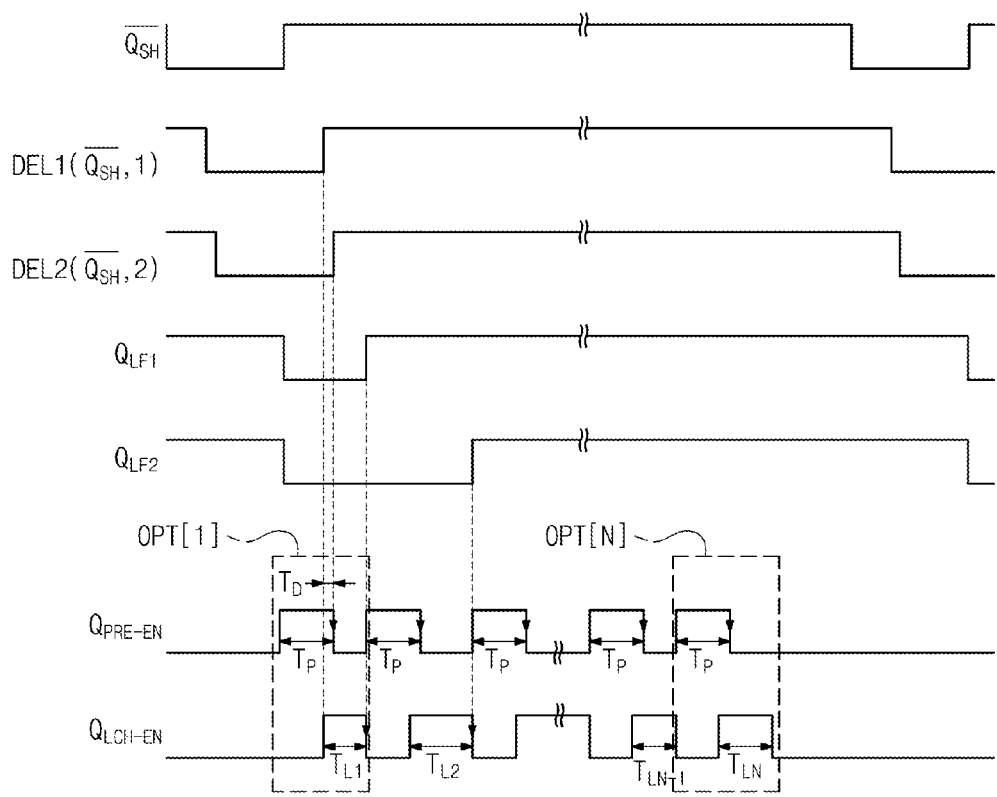
FIG. 7 is a timing diagram illustrating variations in clock signals according to an operation of a pre-amplifier according to an embodiment of the inventive concept.

FIG. 7 is a timing diagram illustrating variations in clock signals according to an operation of a pre-amplifier according to an embodiment of the inventive concept.

Referring to FIG. 7, an inverted version of second system clock signal /$Q_{SH}$ may be used to generate an amplifier operation clock signal $Q_{PRE-EN}$ having a constant operating period of time of $T_P$.

A first delay signal DEL1 may be generated by delaying the inverted version of second system clock signal /$Q_{SH}$ by ($T_P$–$T_D$). Herein, $T_D$ may indicate a time for activating an asynchronous latch unit 142 before an operation of a pre-amplifier 130.

A second delay signal DEL2 may be generated by delaying the inverted version of second system clock signal /$Q_{SH}$ by $T_P$.

Latch operation end signals $Q_{LF1}$ and $Q_{LF2}$ may be generated at falling edges of the latch operation clock signal $Q_{LCH-EN}$, respectively. An amplifier operation clock signal $Q_{PRE-EN}$ may be activated at the falling edges of the latch operation clock signal $Q_{LCH-EN}$, respectively.

The following table 1 may illustrate a logical express of a power controller 120, which generates an amplifier operation clock signal within each of clock periods OTP[1] to OTP[N] of the amplifier operation clock signal $Q_{PRE-EN}$, and a logical express of an asynchronous clock generating unit 141 which generates a latch operation end signal $Q_{LCH-EN}$.

TABLE 1

|  | Power controller $Q_{PRE-EN}$ | Asynchronous clock generating unit $Q_{LCH-EN}$ |
|---|---|---|
| OTP[1] | $\overline{Q_{SH}} \times \overline{DEL2|Q_{SH,2}|}$ | $DEL1|\overline{Q_{SH,1}}| \times \overline{Q_{LF1}}$ |
| OTP[2] | $\overline{Q_{LF1}} \times \overline{DEL2|Q_{LF1,2}|}$ | $DEL1|Q_{LF1,1}| \times \overline{Q_{LF2}}$ |
| ... | ... | ... |
| OTP[N] | $\overline{Q_{LF(N-1)}} \times \overline{DEL2|Q_{LF(N-1),2}|}$ | $DEL1|Q_{LF(N-1),1}| \times \overline{Q_{LF(N)}}$ |

The power controller 120 may generate the amplifier operation clock signal $Q_{PRE-EN}$ according to the logical express in the table 1, and the asynchronous clock generating unit 141 may generate the latch operation clock signal $Q_{LCH-EN}$ at each of N data conversion operations according to the logical express in the table 1.

The inventive concept may save a power by blocking a power at a period where a pre-amplifier of an analog-digital converter does not perform analog-digital conversion. For example, a power saving method of the inventive concept may be applied to a Successive Approximation Register Analog-Digital Converter (SAR-ADC).

Further, the analog-digital converter 100 of the inventive concept may minimize a power consumed to convert an analog signal into a digital signal. Thus, since the analog-digital converter 100 of the inventive concept may have linearity suitable for application necessitating the high degree of precision, it may be applied to medical measurement devices, programmable logic controllers, digital power supply devices, and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An analog-digital converter comprising:
   a pre-amplifier configured to output a comparison result between a sampled analog input signal and a reference signal and to control a power supply operation in response to a power control signal;
   a digital signal processor configured to generate a digital signal based on the comparison result;
   a power controller configured to generate an amplifier operation clock signal for controlling the pre-amplifier; and
   a counter configured to count the number of falling edges of the amplifier operation clock signal and to detect a power interruption point of time of the pre-amplifier according to the counted falling edge number,
   wherein the power controller generates the power control signal for interrupting a power to be supplied to the pre-amplifier when the power interruption point of time of the pre-amplifier is detected.

2. The analog-digital converter of claim 1, wherein the power controller generates the amplifier operation clock signal such that high-level periods have the same period of time.

3. The analog-digital converter of claim 1, wherein the counter detects the power interruption point of time of the pre-amplifier when the number of falling edges reaches a predetermined number.

4. The analog-digital converter of claim 1, wherein the digital signal processor comprises:
   an asynchronous latch unit configured to latch the comparison result to generate a digital signal; and
   an asynchronous clock generating unit configured to generate a latch operation clock signal for controlling the asynchronous latch unit.

5. The analog-digital converter of claim 4, wherein when one digital data included in the digital signal is generated, the asynchronous latch unit generates a latch operation end signal for setting the latch operation clock signal to a low state.

6. The analog-digital converter of claim 3, wherein the power controller sets the amplifier operation clock signal to a logical high state in response to the latch operation end signal.

7. The analog-digital converter of claim 1, further comprising:
   a system clock generating unit configured to generate a system clock signal in response to an external clock signal.

8. The analog-digital converter of claim 7, wherein the system clock generating unit comprises:

a first system clock generating unit configured to generate a first system clock signal in response to the external clock signal; and a second system clock generating unit configured to generate a second system clock signal by delaying the first system clock signal.

9. The analog-digital converter of claim 8, wherein the second system clock signal is used to operate the analog-digital converter and the first system clock signal is used to generate the power control signal.

10. The analog-digital converter of claim 1, further comprising:

an input signal sampler configured to sample an analog input signal to generated a sampled analog signal; and a reference signal generator configured to a reference signal for generation of a digital signal from the sampled analog signal.

11. The analog-digital converter of claim 1, further comprising:

a power supplier configured to power the pre-amplifier.

12. The analog-digital converter of claim 11, wherein the pre-amplifier comprises:

a switch connected to the power supplier and configured to selectively supply a power for the pre-amplifier in response to the power control signal.

13. A power saving method of an analog-digital converter comprising:

supplying a power to a pre-amplifier for outputting a comparison result between an input analog signal and a reference signal;

judging whether the number of data included in a digital signal exceeds a predetermined number, when the digital signal is generated from the analog signal according to the comparison result; and interrupting the power supplied to the pre-amplifier when the number of data included in the digital signal exceeds the predetermined number.

14. The power saving method of claim 13, wherein the supplying a power to a pre-amplifier comprises receiving a clock signal for activating the pre-amplifier after the power is supplied.

15. The power saving method of claim 14, wherein the interrupting the power supplied to the pre-amplifier comprises:

counting the number of falling edges of the amplifier clock signal; and interrupting the power supplied to the pre-amplifier when the counted value reaches a predetermined number.

* * * * *